United States Patent [19]

Miki et al.

[11] 4,025,868

[45] May 24, 1977

[54] FREQUENCY DIGITAL CONVERTER

[75] Inventors: Masayuki Miki, Katsuta; Nobukai Miyakawa, Hitachi, both of Japan

[73] Assignee: Hitachi, Ltd., Japan

[22] Filed: Apr. 3, 1975

[21] Appl. No.: 564,921

[30] Foreign Application Priority Data

Apr. 5, 1974 Japan ............................. 49-37920

[52] U.S. Cl. ................................. 328/141; 328/75; 328/127; 328/129; 324/78 D; 340/347 AD

[51] Int. Cl.² ...................................... G01R 23/02

[58] Field of Search .......... 328/140, 141, 155, 129, 328/75, 127; 324/78 D; 340/347 AD

[56] References Cited

UNITED STATES PATENTS

| | | | |
|---|---|---|---|
| 3,217,144 | 11/1965 | Hinnah | 324/78 D |
| 3,221,250 | 11/1965 | Wang | 328/140 X |
| 3,458,823 | 7/1969 | Nordahl | 328/155 |
| 3,706,935 | 12/1972 | Hughes | 328/141 X |
| 3,914,760 | 10/1975 | Logue | 340/347 AD |

Primary Examiner—John S. Heyman
Attorney, Agent, or Firm—Craig & Antonelli

[57] ABSTRACT

The proposed device serves to convert the input frequencies into corresponding digital values. In the pulse counting means for counting the pulses from a reference oscillator during each period of the input signal to be processed, the frequency of the reference oscillator is varied in a predetermined manner. It is therefore possible to appropriately change the output digital values in accordance with the change in the input frequency, the change in the output digital value being the set characteristic of each of predetermined ranges of frequencies.

17 Claims, 6 Drawing Figures

FREQUENCY DIGITAL CONVERTER

BACKGROUND OF THE INVENTION

1. FIELD OF THE INVENTION

The present invention relates to a device for converting input frequencies into digital values.

2. DESCRIPTION OF THE PRIOR ART

In the conventional frequency detection of the digital type, pulses having a fixed repetition rate are counted during a period of the input signal to be measured and the digital output value is obtained by inverting the value of the count. In this detection system, there is a certain proportional relationship between the input frequency and the output digital value. For example, when the input frequency is doubled, the output value is also doubled and the tripled input frequency results in the trebled output value. Sometimes, there is a need for a case where the digital output value varies in response to the change in the input frequency, not in a linear manner but in accordance with a predetermined characteristic. There has been in the prior art no such device as meets the above mentioned requirement.

Such a device will be described briefly by way of an example. Now, let it be assumed that a pulse is delivered each time the crank shaft of the engine on an automobile rotates through a predetermined constant angle. So, by detecting the repetition rate of such pulses, the rotational speed of the engine can be determined. In case where the rotational speed is used as the factor to determine the amount of fuel injected into the combustion chamber of the engine, the precision of fuel injection control at high rotational speeds differs from that at low rotational speeds. In a high rotation range, e.g. near 6000 rpm, the rotations at 6000 and 6200 rpm's can be maintained with almost the same amount of injected fuel. On the other hand, in a low rotation range, e.g. near 1000 rpm, the rotations at 1000 and 1020 rpm's must be kept respectively with different amounts of injected fuel. This is because the volume of inlet air is considerably changed by a small change in the opening of the throttle valve in the low rotation range while in the high rotation range the volume is not so much changed by rather a large change in the opening.

Thus, the conventional device with a fixed detection accuracy cannot be applied to the case where different detection precisions are needed for different ranges of rotational speeds. In order for the conventional detection device to be adapted for such a case, the device must be provided with an additional circuit having a desired characteristic, which can correct the output of the counting circuit to a predetermined accuracy. With this additional circuit, however, the digital-digital conversion section must be also provided with an additional means for obtaining the desired characteristic. Hence, there is caused a drawback that the overall structure is complicated, the reliability is degraded and the production cost is increased.

If the change in the output digital value, following the change in the input frequency in various manners can be previously set, then the change in the output digital value corresponding to the change in the input frequency can be made large for a frequency range where high accuracy is needed. And under the same circumstances, the change in the output digital value in response to the change in the input frequency can be made small for a frequency range where so high an accuracy is not required.

SUMMARY OF THE INVENTION

One object of the present invention is to provide a frequency digital converter which can produce different changes in the output digital value for different ranges of input frequencies.

Another object of the present invention is to provide a frequency digital converter which can automatically and repeatedly deliver digital outputs in response to iterative input frequencies.

Yet another object of the present invention is to provide a frequency digital converter which can be constituted of rather inexpensive circuit configurations.

According to the present invention, therefore, an oscillator whose oscillation frequency varies depending upon the frequency of the input signal, is employed and the oscillation frequency is renewed each time a predetermined number of pulses are delivered. By suitably selecting the number of the pulses and the oscillation frequency, the change in the output digital value corresponding to the change in the input frequency can be optimized.

DESCRIPTION OF THE PREFERRED EMBODIMENTS

Figure 1:
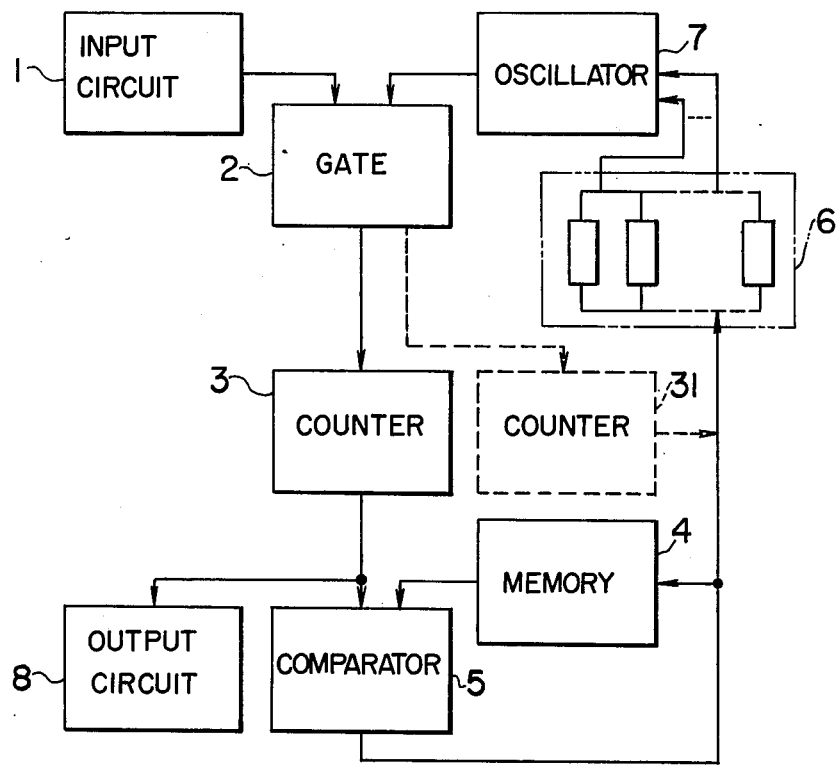
FIG. 1 is a block diagram showing the fundamental structure of the present invention.

In FIG. 1, a reference numeral 1 designates an input circuit to receive an input signal whose frequency is to be detected; 2 a gating circuit which is opened and closed in response to the output signal of the input circuit 1; 3 a counting circuit for counting the output of the gate 2; 4 a memory circuit for storing predetermined values; 5 a comparison circuit for comparing the value counted by the counter 3 with one of the stored values in the memory 4 and for delivering an output when the values coincide with each other; 6 a switching circuit for performing successive switching operations in response to the output of the comparator 5; 7 an oscillator whose function generating factor is successively changed by the output of the switching circuit 6, with the resulting variable frequency; and 8 an output circuit for taking out the content of the counter 3 which is sequentially changed in response to the input signal.

The operation of the general circuit shown in FIG. 1 will be described. When the input signal whose frequency is to be measured is applied to the input circuit 1, the gate 2 is kept open during a time determined on the basis of the period of the input signal. The pulses sent through the gate 2 from the oscillator 7 are counted by the counter 3. The comparator 5 detects the number of the counted pulses and delivers an output when the number is coincident with the signal from the memory 4. The output of the comparator 5 changes over the switching circuit 6 so that the oscillation frequency of the oscillator 7 is changed. The output of the comparator 5 also causes the memory 4 to deliver a new signal indicating the number of pulses to be counted on the basis of the renewed oscillation frequency. The comparator 5 again detects the number of the renewed pulses and delivers an output when the number coincides with the new number represented by the new signal from the memory 4. The output of the comparator 5 again changes over the switching circuit 6 to renew the output of the memory 4. Thus, the oscillation frequencies of the oscillator 7 are sequentially selected in a predetermined manner until the gate 2 is closed.

The memory 4 stores pieces of information, each representing how many pulses should be delivered for each of the different oscillation frequencies by the oscillator, in the order in which the different oscillation frequencies are successively selected.

If the relationship between the change in the input frequency and the change in the output digital value is comparatively simple, the number of pulses for each oscillation frequency may be fixed. In such a case, the memory 4 and the comparator 5 are replaced by a counter 31 (designated by dashed line in FIG. 1) for counting only a constant number of pulses. When the constant number of pulses are sent from the oscillator 7 through the gate 2 to the counter 31, the counter 31 delivers an output pulse indicating that the predetermined number of pulses have been received. The output pulse applied to the switching circuit 6 advances the circuit 6 to the next step so that the oscillation frequency of the oscillator is renewed. The counter 31 is restored to the initial state and again starts counting. The counter 31 finds its concrete example in an ordinary counter which overflows. With this counter, when a predetermined number of pulses are counted, all the digits of the counter become "1" so that an output signal is applied to the switching circuit 6. Upon receiving the next pulse, the counter has all its digits turned to "0" and resumes counting the new set of pulses. A preset counter now on the market may also be used as the counter 31.

Next, the oscillator 7 used in the circuit shown in FIG. 1 will be described by way of example with the aid of FIG. 2.

Figure 2:
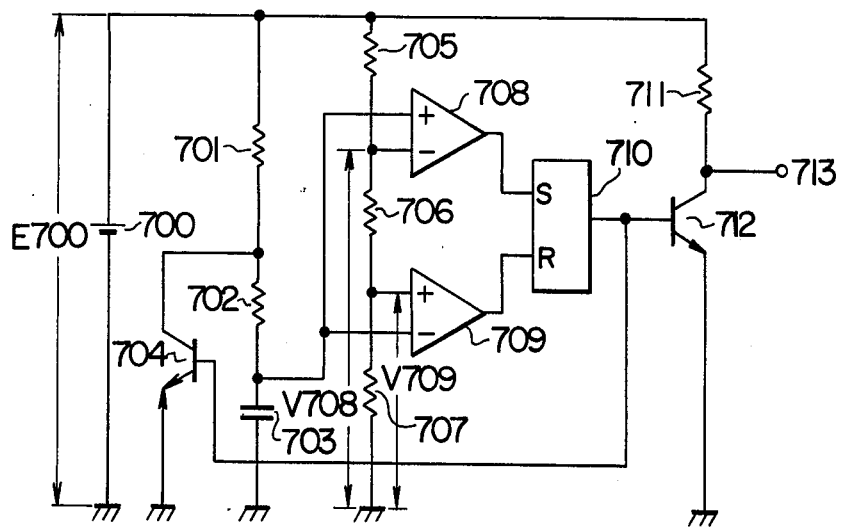
FIG. 2 is the circuit diagram for illustrating the operation of the oscillator shown in FIG. 1.

In FIG. 2, a reference numeral 700 indicates a battery with its negative electrode grounded, which is an example of power source used in the circuit according to the present invention; resistors 701 and 702, a capacitor 703 and an NPN transistor 704 constitute the time constant circuit of the oscillator in question, the resistor 701 with its one end connected with the positive electrode of the power source 700, the resistor 702 with its one end connected with the resistor 701, the capacitor 703 with its ends connected respectively with the resistor 702 and the earth, and the transistor 704 with its collector connected with the resistor 701 and its emitter grounded.

The operation of the oscillator circuit in FIG. 2 is as follows. When the transistor 704 is cut off, the capacitor 703 is charged with a time constant determined by the resistance R701 of the resistor 701, the resistance R702 of the resistor 702 and the capacitance C703 of the capacitor 703. The time required for fully charging the capacitor 703 is given by the following formula (1).

$$t_c = C703 \cdot (R701 + R702) \cdot \ln\left(\frac{E700 - V708}{E700 - V709}\right) \quad (1)$$

Here, E700 is the voltage of the battery 700, V708 the voltage between the terminal (−) of a comparator 708 and the earth, and V709 the voltage between the terminal (+) of a comparator 709 and the earth.

When the transistor 704 is turned conductive, the electric charges stored in the capacitor 703 are released through the resistor 702 and the transistor 704. The time required for the complete discharge of the capacitor 703 is given by the following formula (2).

$$t_d = C703 \cdot R702 \ln\left(\frac{V709}{V708}\right) \quad (2)$$

Therefore, the period T covering the charge and discharge of the capacitor is given by the formula (3).

$$T = t_c + t_d$$
$$= C703\left\{(R701 + R702)\ln\left(\frac{E700 - V708}{E700 - V709}\right) + R702 \ln\left(\frac{V709}{V708}\right)\right\} \quad (3)$$

As a result, the frequency of the charging and discharging cycles, i.e. the oscillation frequency, is equal to the reciprocal of the period T.

Elements 705 and 707 constitute a reference output circuit. The resistor 705 is connected at its one end with the positive electrode of the power source and at the other end with one end of the resistor 706. The other end of the resistor 706 is connected with one end of the resistor 707, the other end of which is grounded. Hence, the reference voltage is obtained by dividing the power source voltage by the resistors 705 to 707.

Elements 708 and 709 form a comparison circuit in the oscillator. The comparator 708 has its positive and negative terminals connected respectively with the resistors 702 and 705 and the comparator 709 has its positive and negative terminals connected respectively with the resistor 706 and the resistor 702.

The operation of the reference output circuit and the comparison circuit is as follows. Let the voltage between the junction point of the resistors 705 and 706 and the earth, i.e. the voltage at the negative input terminal of the comparator 708, and the voltage between the junction point of the resistors 706 and 707 and the earth, i.e. the voltage at the positive input terminal of the comparator 709, be represented respectively by V708 and V709, as shown in FIG. 2. Then, if the voltage $V_c$ developed across the capacitor 703 due to the charging thereof exceeds the voltage V708, the output of the comparator 708 is changed from the ground level to the level equal to the voltage of the power source (referred to as power source level) while the output of the comparator 709 is changed from the power source level to the ground level when the voltage $V_c$ exceeds V709. On the other hand, if the voltage $V_d$ across the capacitor 703 during the discharge thereof due to the conduction of the transistor 704 falls below both V708 and V709, the comparators 708 and 709 perform level transitions opposite to those described above.

A set-reset flip-flop 710 has its set and reset terminals connected respectively with the output terminals of the comparators 708 and 709. Accordingly, the flip-flop 710 is set when the output of the comparator 708 is changed from the ground level to the power source level, so that it then delivers an output voltage near equal to the source voltage. And it is reset when the output of the comparator 709 is changed from the power source level to the ground level, so that the output of the flip-flop 710 is then at the ground level. This output of the flip-flop 710 is used as the base signal for the transistor 704 to cut off and turn on the transistor 704.

Elements 711 and 712 compose an output circuit, the resistor 711 being connected at its one end with the positive electrode of the power source and the NPH transistor 712 having its base, collector and emitter connected respectively with the output of the flip-flop 710, the other end of the resistor 711 and the earth. An output terminal 713 is provided at the collector of the transistor 712. When the output of the flip-flop 710 is at the power source level, the transistor 712 draws base current so that the transistor 712 is turned conductive to keep the output terminal 713 at the ground level. On the other hand, when the output of the flip-flop 710 is at the ground level, the transistor is cut off so that the output terminal 713 is kept at the power source level.

Figure 3:
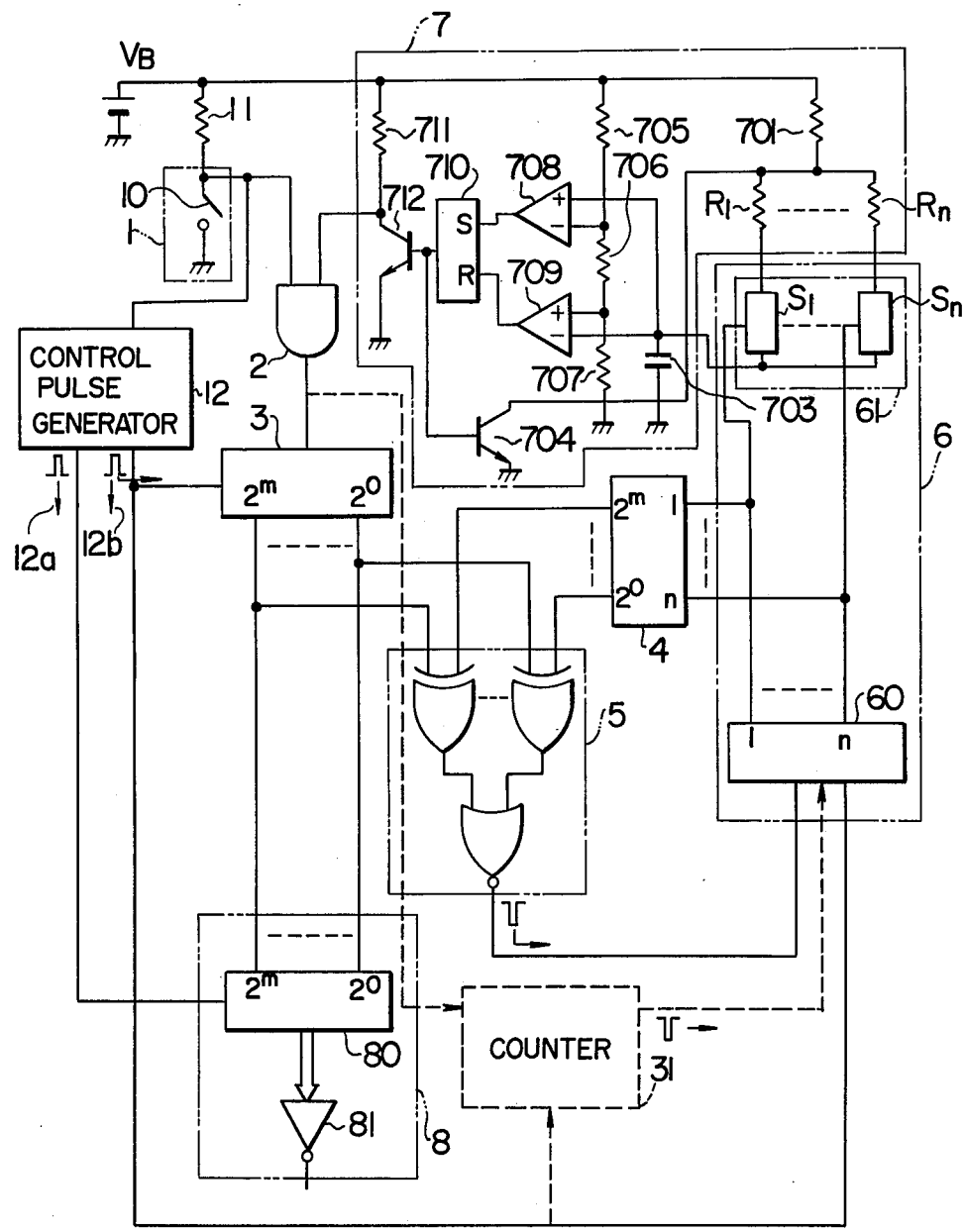
FIG. 3 is the circuit of one embodiment of the present invention.

FIG. 3 shows an embodiment of the present invention. In the figure, an input circuit 1 serves to obtain digital input signals corresponding to different rotational speeds from the contact of the distributor, an auxiliary contact 10 is opened and closed in timing with the distributor, and a resistor 11 is connected between the positive electrode of a power source $V_B$ and the auxiliary contact 10. A control pulse generator 12 performs clearing operations and serves to control the output of the established data. Namely, the generator 12 produces a latch signal 12a and a reset signal 12b.

The auxiliary contact 10 is turned on and off in timing with the rotation of the distributor. When the contact 10 is opened, a voltage substantially equal to the voltage of the power source ($V_B$ referred to also as power source level) is applied to the generator 12 while the input of the generator 12 is at the ground level when the auxiliary contact 10 is closed. The control pulse generator 12 also detects the change of the potential at that end of the resistor 11 which is connected with the contact 10, from the power source level to the ground level, and delivers a latch signal 12a and a reset signal 12b.

A gate 2 with its one input connected with the resistor 11 receives such as ON-OFF signal as consisting of the power source level $V_B$ and the ground level O delivered by the output circuit 1.

A counter 3 has its clock signal input terminal and reset signal input terminal connected with the output terminal of the gate 2 and the reset signal output terminal of the control pulse generator 12, respectively. The counter 3 counts the pulses of the signal from the gate 2.

Predetermined control signal patterns are written in a memory 4, which has call words 1 to n. A comparator 5 has its inputs connected with the outputs of the counter 3 and of the memory 4.

The operations of the counter 3, the memory 4 and the comparator 5 are as follows. The number of the pulses counted by the counter 3 is compared with the value stored previously in the memory 4 by the comparator 5. If the number coincides with the value, the comparator 5 delivers an output pulse to the next stage. If, on the other hand, no coincidence is detected, the words 1 to n are successively changed over until there is a coincidence between the number and the value delivered from the memory 4.

A shift register 60 has its clock signal input terminal connected with the output of the comparator 5 and the output terminals of the register 60 are successively changed over each time the register 60 receives a clock input, that is, the output terminals 1 to n are sequentially selected one after another in response to the successive arrival of the clock pulses. A switching circuit 61 consists of switches $S_1$ to $S_n$ connected respectively with the output terminals 1 to n of the shift register 60. Each time a pulse is delivered from the comparator 5, the shift register 60 having its change-over components 1 to n and the switching circuit 61 having the switches $S_1$ to $S_n$ operated in timing with them, are changed over simultaneously. The shift register 60 is reset by the reset signal 12b delivered by the control pulse generator 12.

An oscillating circuit 7 is connected at its one end with a resistor 701 and at the other end with the input of the gate 2.

The operation of this oscillating circuit 7 is similar to that of the circuit shown in FIG. 2. Namely, the resistive elements $R_1$ to $R_n$ of the oscillator 7 which correspond to the resistor 702 in FIG. 2 are successively changed over by the output signal from the switching circuit 61 so that the oscillation frequencies are accordingly switched over. The output of the oscillator 7 is then applied to the input of the gate 2. An output circuit 8 is connected with the counter 3. The output circuit 8 comprises a latch circuit 80 having its input terminals $2^o$ to $2^m$ connected respectively with the output terminals $2^o$ to $2^m$ connected respectively with the output terminals $2^o$ to $2^m$ of the counter 3 and an inverter 81 for inverting the signal from the output terminals $2^o$ to $2^m$ of the latch circuit 80. The output circuit 8 serves to deliver an output representing the number of pulses counted by the counter 3 which changes from time to time in accordance with the rotational speeds.

Figure 4:
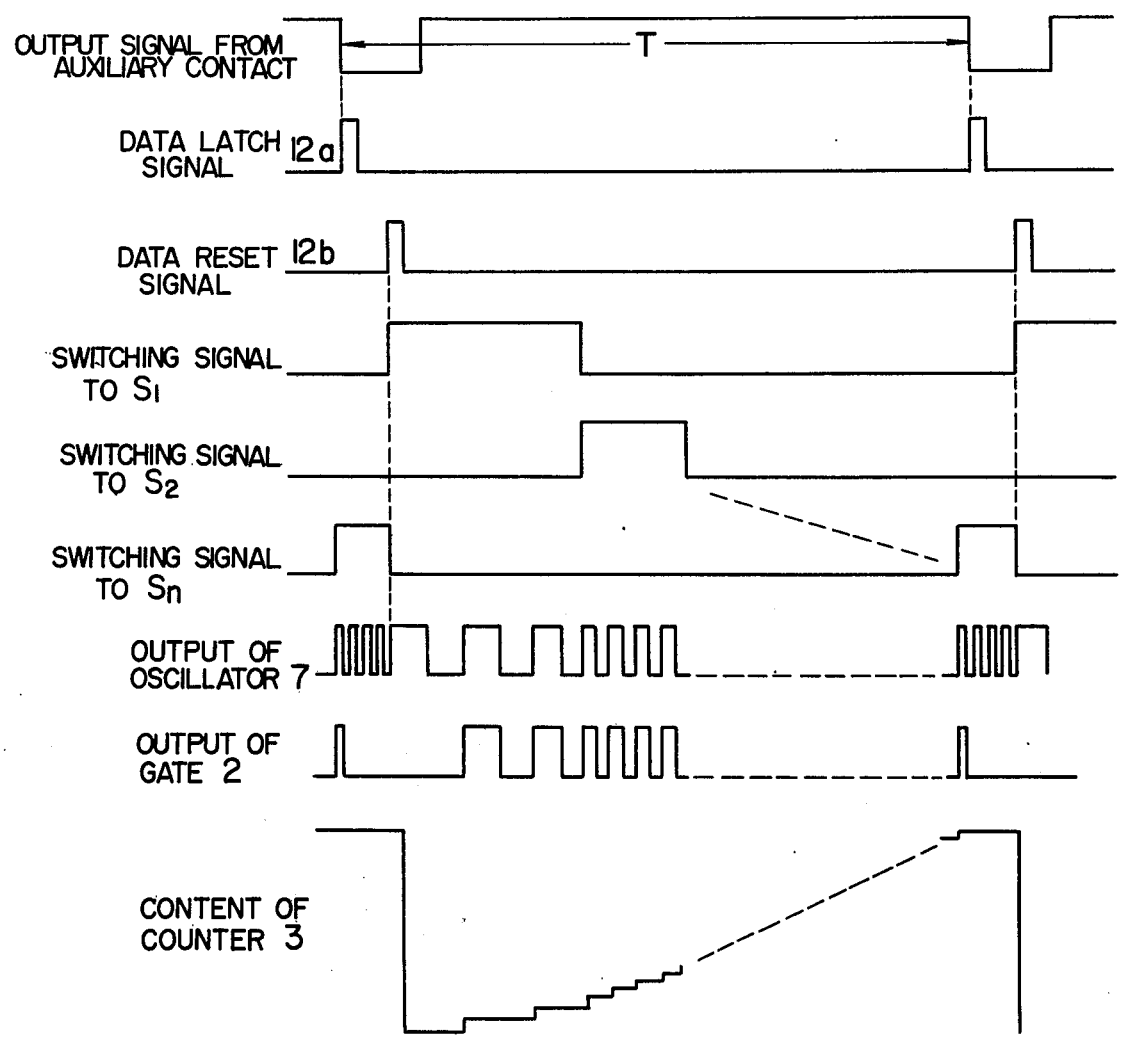
FIG. 4 is a time chart useful to explain the operation of the circuit shown in FIG. 3.

FIG. 4 shows the waveforms of signals appearing at various points in the circuit shown in FIG. 3. When the output signal at the auxiliary contact 1 is changed from the high level, i.e. power source level, to the low level, i.e. ground level, a data latch signal is delivered by the control pulse generator 12, as shown in FIG. 4, to latch the content of the counter 3 in the just previous period of the output signal at the auxiliary contact 1. When the output signal is still at the low level after the data latch signal was delivered, a data reset signal to reset the counter 3 for the purpose of obtaining data in the next period is delivered by the generator 12, as shown in FIG. 4. Upon delivery of the data reset signal, the switching circuit 6 sends a first switching signal to the switch $S_1$ of the switching circuit 61. Accordingly, the resistor $R_1$ of the oscillator 7 is selected so that the output signal having a frequency determined by the resistors 701 and $R_1$ and a capacitor 703 is counted by the counter 3. When the content of the counter 3 coincides with the value from the memory 4, the switching circuit 6 sends a second switching signal to the switch $S_2$. So, the resistor $R_2$ of the oscillator 7 is selected and then the oscillator 7 delivers an output signal having a frequency determined by the resistors 701 and $R_2$ and the capacitor 703. The output signal is added to the previous content of the counter 3. Moreover, when the switching signal to $S_1$ is succeeded by that to $S_2$, the address of the memory is also renewed. Accordingly, if the content of the counter 3 corresponding to the switching signal to $S_2$ is coincident with the value delivered from the memory 4, the switching signal to $S_2$ is succeeded by the switching signal to $S_3$. Thereafter, similar change-over operations will follow until the complete cycle is covered. The signal delivered by the oscillator 7 according to the switching signals from the switching circuit 6 and the output signal of the gate 2 are both as shown in FIG. 4 and the content of the counter 3 as a result of counting over one period will also be as shown in FIG. 4.

As described before, if the memory has only to deliver a sole value, the memory 4 and the comparator 5 can be replaced by a counter 31 as shown by dashed line in FIG. 4.

Figure 5:
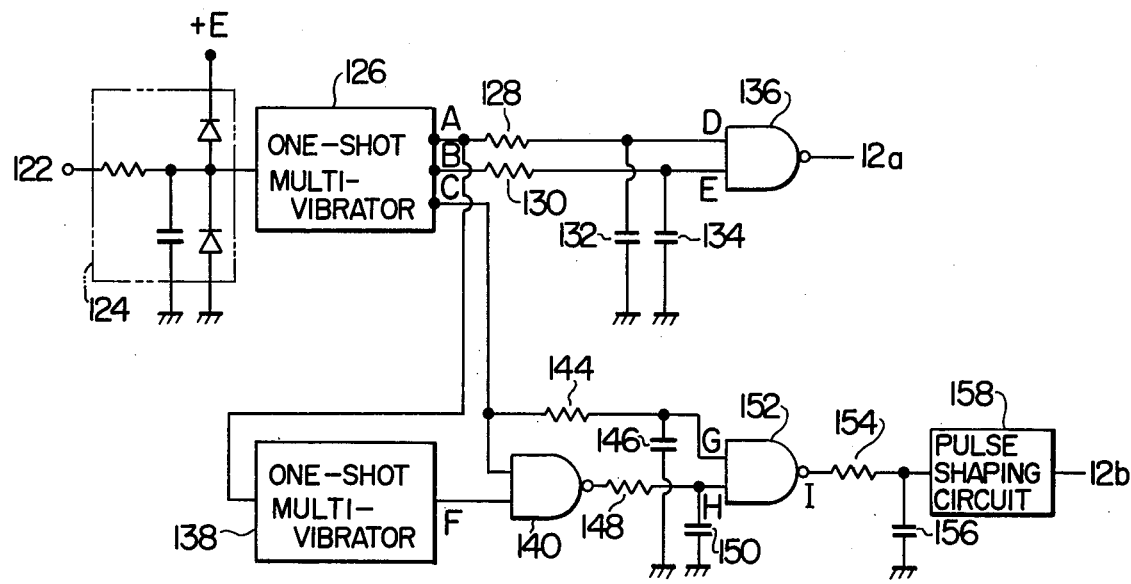
FIG. 5 is a concrete example of the control pulse generating circuit shown in FIG. 3.
Figure 6:
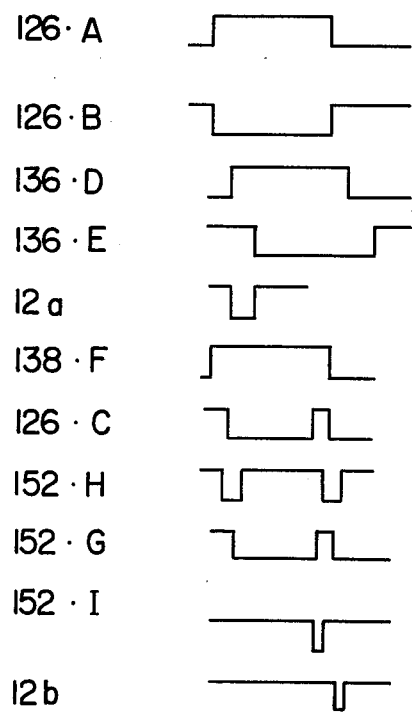
FIG. 6 shows the waveforms of various voltages appearing at the points in the circuit in FIG. 5 and useful for explaining the operation of the circuit.

FIG. 5 shows the circuit of a concrete example of the control pulse generator 12 in FIG. 3 and FIG. 6 shows waveforms useful to explain the operation of the circuit in FIG. 5.

The signal which a terminal 122 received from the auxiliary contact 10, is sent through a noise eliminating circuit 124 to a one-shot multivibrator 126, the output terminals A and B of which deliver such signals as shown in FIG. 6. A combination of a resistor 128 and a capacitor 132 and a combination of a resistor 130 and a capacitor 134 respectively function as delay elements. Accordingly, the input signals to the input terminals D and E of a NAND gate 136 are as shown at 136D and 136E in FIG. 6 so that the latch signal 12a as shown in FIG. 6 is produced.

A one-shot multivibrator 138 is driven by the output signal 126A of the one-shot multivibrator 126 and delivers an output signal 138F as shown in FIG. 6. The multivibrator 126 delivers at its output terminal C an output signal 126C as shown in FIG. 6, which is then applied to a NAND gate 140. The output of the NAND gate 140 is delayed through a delay element consisting of a resistor 148 and a capacitor 150 and applied to the input terminal H of a NAND gate 152. The input signal to the terminal H is as shown at 152H in FIG. 6.

The signal 126C from the output terminal C of the multivibrator 126 is also sent through a delay element consisting of a resistor 144 and a capacitor 146 to the input terminal G of the NAND gate 152. The input signal to the terminal G is as shown at 152G in FIG. 6. The output signal from the NAND gate 152, as shown at 152I in FIG. 6, is sent through a delay element consisting of a resistor 154 and a capacitor 156 to a pulse shaping circuit 158, which in turn produces a reset signal 12b as shown in FIG. 6.

As described above, according to the present invention, the frequency (period) of the input signal can be non-linearly converted to the corresponding digital quantity, the production cost can be lowered, and the device can be reduced in size. Moreover, if the present invention is used as a rotation detecting means applied to a digital type fuel injection control apparatus, the precision in the follow-up control can be approximated to an optimal one.

We claim:
1. A frequency digital converter comprising:
input means for receiving an input signal whose frequency is to be measured;
an oscillator including frequency changing means for changing the oscillation frequency of said oscillator in a stepped manner, in accordance with a received instruction signal;
counting means connected to said input means and said oscillator for counting the output pulses of said oscillator during a time determined on the basis of said frequency of said input signal;
means connected to said counting means for producing said instruction signal having a value in accordance with a respective predetermined number of pulses corresponding to each oscillating frequency step of said oscillator;
means for applying said instruction signal to said frequency changing means in said oscillator; and
digital output means for taking out the content of said counting means.
2. A frequency digital converter as claimed in claim 1, wherein said oscillator comprising a plurality of time constant circuits and a change-over means for switching over said time constant circuits and wherein said change-over means is operated by said instruction signal so that the time constant and hence the oscillation frequency of said oscillator is changed.
3. A frequency digital converter as claimed in claim 2, wherein there are further provided a data holding means and a control means, said control means delivering latch signal and a reset signal at the end of each period of said input signal and said data holding means holding said content of said counting means in response to said latch signal and wherein said counting means and said means for producing said instruction signal are both reset by said reset signal.
4. A frequency digital converter as claimed in claim 2, wherein said time constant circuit and said means for changing over said time constant circuits comprise a capacitor, a plurality of resistors, a plurality of switching means which are the same in number as said resistors, a first connecting means for constructing a plurality of series circuits each consisting of one of said resistors and one of said switching means, and a second connecting means for connecting said capacitor and each of said series circuits in a closed loop and wherein said switching means are operated by said instruction signal to change the time constant.
5. A frequency digital converter as claimed in claim 2, wherein said time constant circuits and said means for changing over said time constant circuits comprise a resistor, a plurality of capacitors, a plurality of switching means which are the same in number as said capacitors, a first connecting means for constructing a plurality of series circuits each consisting of one of said capacitors and one of said switching means, and a second connecting means for connecting said resistor and each of said series circuits in a closed loop and wherein said switching means are operated by said instruction signal to change the time constant.
6. A frequency digital converter as claimed in claim 1, wherein said oscillator comprises a plurality of time constant circuits and a switching means for connecting said time constant circuits to said oscillator, a first time constant circuit of said time constant circuits being at first connected to said oscillator by means of said switching means, a second time constant circuit being connected to said oscillator upon receipt of said instruction signal by said frequency changing means, said switching means being operated in a predetermined sequence every time said frequency changing means receives said instruction signal, thereby connecting each of said time constant circuits to said oscillator in said predetermined sequence.

7. A frequency digital converter comprising:
an input means for receiving an input signal whose frequency is to be measured;
an oscillator whose oscillation frequency is varied in accordance with an instruction signal;
a first counting means for counting the output pulses of said oscillator during a time determined on the basis of said frequency of said input signal;
a second counting means for counting the pulses applied from said oscillator to said first counting means; and
a means for delivering said instruction signals when the content of said second counting means becomes equal to the preset value, wherein said second counting means is reset when the content of said second counting means becomes equal to said preset value.

8. A frequency digital converter as claimed in claim 7, wherein said oscillator comprises a plurality of time constant circuits and a change-over means for switching over said time constant circuits and wherein said change-over means is operated by said instruction signal so that the time constant and hence the oscillation frequency of said oscillator is changed.

9. A frequency digital converter as claimed in claim 8, wherein there are further provided a control circuit for producing a latch signal and a reset signal at the end of each period of said input signal, a holding means for holding the content of said first counting means in response to said latch signal, a first connecting means for applying said reset signal to said first counting means so as to reset said first counting means, and a second connecting means for applying said reset signal to said means for producing said instruction signal so as to reset said instruction signal producing means.

10. A frequency digital converter as claimed in claim 8, wherein said time constant circuits and said means for changing over said time constant circuits comprise a capacitor, a plurality of resistors, a plurality of switching means the number of which is the same as that of said plural resistors, a first connecting means for constructing a plurality of series circuit each consisting of one of said resistors and one of said switching means, and a second connecting means for connecting said capacitor and each of said series circuits in a closed loop and wherein said switching means are operated by said instruction signal to change the time constant.

11. A frequency digital converter as claimed in claim 8, wherein said time constant circuits and said means for changing over said time constant circuits comprise a resistor, a plurality of capacitors, a plurality of switching means the number of which is the same as that of said plural capacitors, a first connecting means for constructing a plurality of series circuits each consisting of one of said capacitors and one of said switching means, and a second connecting means for connecting said resistor and each of said series circuits in a closed loop and wherein said switching means are operated by said instruction signal to change the time constant.

12. A frequency digital converter comprising:
an input means for receiving an input signal whose frequency is to be measured;
an oscillator including frequency changing means for changing the oscillation frequency of said oscillator in a stepped manner, in accordance with a received instruction signal;
a counting means for counting the output pulses of said oscillator during a time determined on the basis of said frequency of said input signal;
a memory means for storing a predetermined number; and
a means for delivering said instruction signal when the predetermined number in said memory means becomes equal to the content of said counting means.

13. A frequency digital converter as claimed in claim 12, wherein said oscillator comprises a plurality of time constant circuits and a change-over means for switching over said time constant circuits and wherein said change-over means is operated by said instruction signal so that the time constant and hence the oscillation frequency of said oscillator is changed.

14. A frequency digital converter as claimed in claim 13, wherein there are further provided a control circuit for producing a latch signal and a reset signal at the end of each period of said input signal, a holding means for holding the content of said counting means in response to said latch signal, a first connecting means for applying said reset signal to said counting means so as to reset said counting means, and a second connecting means for applying said reset signal to said means for producing said instruction signal so as to reset said instruction signal producing means.

15. A frequency digital converter as claimed in claim 13, wherein said time constant circuits and said means for changing over said time constant circuits comprise a capacitor, a plurality of resistors, a plurality of switching means the number of which is the same as that of said plural resistors, a first connecting means for constructing a plurality of series circuit, each consisting of one of said resistors and one of said switching means, and a second connecting means for connecting said capacitor and each of said series circuits in a closed loop and wherein said switching means are operated by said instruction signal to change the time constant.

16. A frequency digital converter as claimed in claim 13, wherein said time constant circuits and said means for changing over said time constant circuits comprise a resistor, a plurality of capacitors, a plurality of switching means the number of which is the same as that of said plural capacitors, a first connecting means for constructing a plurality of series circuits each consisting of one of said capacitors and one of said switching means, and a second connecting means for connecting said resistor and each of said series circuits in a closed loop and wherein said switching means are operated by said instruction signal to change the time constant.

17. A frequency digital converter as claimed in claim 12, wherein said means for delivering said instruction signal comprises a comparator means.

* * * * *